US008552310B2

(12) United States Patent
Hashimoto

(10) Patent No.: US 8,552,310 B2
(45) Date of Patent: Oct. 8, 2013

(54) MOUNTING STRUCTURE OF ELECTRONIC COMPONENT

(75) Inventor: Nobuaki Hashimoto, Suwa (JP)

(73) Assignee: Seiko Epson Corporation (JP)

( * ) Notice: Subject to any disclaimer, the term of this patent is extended or adjusted under 35 U.S.C. 154(b) by 88 days.

(21) Appl. No.: 13/346,087

(22) Filed: Jan. 9, 2012

(65) Prior Publication Data

US 2012/0103673 A1 May 3, 2012

Related U.S. Application Data

(63) Continuation of application No. 12/178,055, filed on Jul. 23, 2008, now Pat. No. 8,106,304.

(30) Foreign Application Priority Data

Aug. 21, 2007 (JP) ................................ 2007-214512

(51) Int. Cl.
*H05K 1/11* (2006.01)
*H05K 1/02* (2006.01)
*H05K 1/16* (2006.01)
*H05K 7/12* (2006.01)
*H05K 1/14* (2006.01)

(52) U.S. Cl.
USPC ........... 174/261; 174/259; 174/260; 361/767; 361/792; 361/793; 361/794; 361/795

(58) Field of Classification Search
USPC ................ 174/259, 260, 261; 361/792–795, 361/767
See application file for complete search history.

(56) References Cited

U.S. PATENT DOCUMENTS

| | | | | |
|---|---|---|---|---|
| 5,415,555 | A * | 5/1995 | Sobhani | 439/74 |
| 7,495,927 | B2 * | 2/2009 | Furihata et al. | 361/760 |
| 7,705,454 | B2 | 4/2010 | Hashimoto | |
| 7,851,912 | B2 | 12/2010 | Hashimoto | |
| 2005/0062153 | A1 * | 3/2005 | Saito et al. | 257/737 |
| 2005/0205296 | A1 * | 9/2005 | Ito | 174/256 |
| 2005/0236104 | A1 | 10/2005 | Tanaka | |
| 2006/0043552 | A1 * | 3/2006 | Suga et al. | 257/678 |
| 2006/0060983 | A1 * | 3/2006 | Saito | 257/780 |
| 2007/0010045 | A1 | 1/2007 | Asakawa et al. | |
| 2008/0254610 | A1 | 10/2008 | Suga et al. | |

FOREIGN PATENT DOCUMENTS

| | | |
|---|---|---|
| CN | 1913138 | 2/2007 |
| JP | 2001-217281 | 8/2001 |
| JP | 2002-261407 | 9/2002 |
| JP | 2006-128364 | 5/2006 |

(Continued)

*Primary Examiner* — Timothy Thompson
*Assistant Examiner* — Sherman Ng
(74) *Attorney, Agent, or Firm* — Harness, Dickey & Pierce, P.L.C.

(57) ABSTRACT

A mounting structure of an electronic component includes: a bump electrode included in the electronic component, the bump electrode having an internal resin as a core and a conductive film covering a surface of the internal resin, and elastically deforming so as to follow a shape of at least one corner of a terminal so that the conductive film makes direct conductive contact with at least part of a top surface of the terminal and at least part of a surface along a thickness direction of the terminal; a substrate having the terminal and the electronic component that is mounted on the substrate; and a holding unit provided to the substrate and the electronic component so as to hold a state in which the bump electrode electrically deformed makes conductive contact with the terminal.

10 Claims, 7 Drawing Sheets

30 121 13 L1 L2 111 14 11a 11A 12 14 11a 11B 12

(56) References Cited

FOREIGN PATENT DOCUMENTS

| | | |
|---|---|---|
| JP | 2007-019409 | 1/2007 |
| JP | 2007-42734 | 2/2007 |
| JP | 2007-066937 | 3/2007 |
| JP | 2007-281216 | 10/2007 |
| JP | 2008-277647 | 11/2008 |

* cited by examiner

MOUNTING STRUCTURE OF ELECTRONIC COMPONENT

CROSS-REFERENCE TO RELATED APPLICATIONS

This is a continuation application of U.S. application Ser. No. 12/178,055 filed Jul. 23, 2008, which claims priority to Japanese Patent Application No. 2007-214512, filed Aug. 21, 2007 which is expressly incorporated by reference herein in its entirety.

BACKGROUND

1. Technical Field

The present invention relates to a mounting structure of an electronic component.

2. Related Art

Mounting techniques are used in mounting, on a substrate, electronic components such as semiconductor integrated circuit, in order to manufacture a circuit substrate mounted on various electronic apparatuses as well as liquid crystal devices. A liquid crystal display device, for instance, includes an integrated circuit (IC) chip for liquid crystal drive so as to drive the liquid crystal panel mounted thereon. This IC chip for liquid crystal drive may also be mounted directly on a glass substrate that constitutes the liquid crystal panel, or, may be mounted on a flexible substrate (FPC) which is mounted on the liquid crystal panel. A mounting structure mounted by the former technique is called a chip on glass (COG) structure, and a mounting structure mounted by the latter is called a chip on flexible print circuit (COF) structure. In addition to these mounting structures, a chip on board (COB) structure may also be used. In this structure, an IC chip is mounted on, for instance, a glass-epoxy substrate.

Substrates used for such mounting structures include lands (terminals) coupled to a wiring pattern, and electronic components used include bump electrodes for obtaining electric connection. Mounting structures of electronic components are formed by mounting electronic components on the substrates in a state in which the lands are coupled to the bump electrodes.

It has been desired that, in those mounting structures, electronic components be firmly and securely coupled to substrates. Particularly, in the case where there are pluralities of lands and bump electrodes, and where the lands are coupled to the bump electrodes, it is important that all the lands and bumps are coupled well, in order to ensure reliability.

However, since lands and bump electrodes are generally formed with metal, a mispositioning during bonding and a misalignment caused by a low aligning precision of lands and bump electrodes may result in a contact defect (conductive defect) originating from insufficient bonding strength between these lands and bump electrodes.

Moreover, a fluctuation in distance may be caused between lands and bump electrodes by a warping of electronic components such as substrates and ICs as well as by a fluctuation in the height of lands and bump electrodes being formed. This may result in an inability to obtain sufficient bonding strength between the bump electrodes and the terminals, causing a contact defect (conductive defect).

In order to prevent such disadvantages, what has been provided is a print circuit board that includes a conductive pattern having a trapezoid section, a metal conductive layer formed thereon, and multiple concavities and convexities applied on a surface of this metal conductive layer (refer to JP-A-2002-261407 for an example).

Such a print circuit board is said to provide improved mounting yield, due to the anchoring effect originating from the concavities and convexities on the metal conductive surface. The anchoring effect prevents connecting electrodes of a component (electronic component) from slipping or sliding and getting inclined on electrodes on the substrate, when pressure is applied during component mounting.

However, while the slipping, the sliding, and the inclination of connecting electrodes (bump electrode) arranged over the metal conductive layer are prevented by the anchor effect originating from the concavities and convexities of the metal conductive surface, the above-mentioned print circuit board does not have a structure that increases the bonding strength between the metal conductive substrate and the connecting electrode. Further, the structure does not increase the bonding strength between a plurality of electrodes. Consequently, occurrences of the mispositioning during bonding and the misalignment between electrodes (lands and bump electrodes) caused by low aligning precision therebetween may still result in a contact defect (conductive defect) originating from insufficient bonding strength between these electrodes. Moreover, the connecting electrodes are formed with metal, and therefore exhibit plastic deformation upon coupling. This means that, if the distance between the lands and the electrodes are not constant as described above, the connecting electrodes may have a low capability in absorbing the distance deviation with elastic deformation, and therefore the bonding strength between these electrodes may be insufficient. For this reason, the contact defect (conductive defect) may still occur as well.

SUMMARY

An advantage of the invention is to provide a mounting structure of an electronic component that exhibits an improved bonding strength between a bump electrode and a terminal on a substrate with improved reliability in a conductive connection status.

According to an aspect of the invention, a mounting structure of an electronic component includes: a bump electrode included in the electronic component, the bump electrode having an internal resin as a core and a conductive film covering a surface of the internal resin, and elastically deforming so as to follow a shape of at least one corner of a terminal so that the conductive film makes direct conductive contact with at least part of a top surface of the terminal and at least part of a surface along a thickness direction of the terminal; a substrate having the terminal and the electronic component that is mounted on the substrate; and a holding unit provided to the substrate and the electronic component so as to hold a state in which the bump electrode electrically deformed makes conductive contact with the terminal.

According to this mounting structure of an electronic component, the bump electrode has the internal resin as a core. Therefore, by applying pressure on the terminal on the substrate, the bump electrode is easily pressed and reaches an elastically (compressively) deformed state. Bonding the bump electrode to the terminal with the aforementioned elastic deformation allows the bump electrode to follow the shape of the terminal, in order for the conductive film to be in directly conductive contact with at least part of the top surface as well as at least part of the surface along the thickness direction of the terminal, even is there is, for instance, a misalignment between the bump electrode and the terminal, causing the bump electrode to abut the corner of the terminal. Therefore, this conductive contact status being held with the holding unit ensures a sufficient contact area between the terminal and the conductive film of the bump electrode, and this provides a preferable conductive connection status.

Elastic restoring force (repelling force) increases the bonding strength between the internal resin and the terminal, the elastic restoring force being generated in the bump electrode against the terminal of the substrate due to the elastic deformation of the internal resin in the bump electrode, thereby improving the reliability of the conductive connection status. Specifically, the restoring force of the internal resin caused by the elastic deformation of the bump electrode works so that the bump electrode wraps the corner, the restoring force originating from following at least one corner shape of the terminal. Therefore, the bonding strength between the bump electrode and the terminal is increased as described.

It is preferable that, in the mounting structure of an electronic component, the holding unit be composed by a sealing resin filled and cured around a conductive contact area of the bump electrode and the terminal.

This ensures the more preferable status of conductive contact between the terminal and the elastically deforming bump electrode, thereby improving the conductive connection status between the terminal and the conductive film of the bump electrode.

In this case, the bump electrode may be provided to the electronic component in plurality and the terminal is provided to the substrate in plurality. The plurality of terminals may include at least two terminals each having a different distance from the top surface thereof to a surface of the electronic component for forming the bump electrodes. The bump electrodes may include at least two bump electrodes corresponding to the at least two terminals, the at least two bump electrodes elastically deforming in a different degree according to the distance from each top surface of the at least two terminals to the surface of the electronic component for forming the bump electrodes.

In case of the pluralities of the terminals and the bump electrodes respectively being formed on the substrate and on the electronic component, a substrate distortion may cause a fluctuation in the height (level) of the bonding surface of each of the terminals. This causes the top surfaces of the plurality of terminals to have different distances relative to the forming surface of the bump electrode of the electronic component. Similarly, the electronic component may have an uneven height at the bonding surface of the bump electrodes.

Moreover, when coupling the substrate and the electronic component at the pluralities of bump electrodes and terminals, if there is a fluctuation in the distance between the bump electrodes and the terminals prior to their bonding, it becomes difficult to couple all the bump electrodes and all the terminals in a preferable strength. Here, the substrate includes terminals with uneven height, and the electronic component includes bump electrodes with uneven height.

However, in the mounting structure according to an aspect of the invention, the degree of elastic deformation of the bump electrodes varies in proportion with the distance kept by the top surfaces of the terminals in the electronic component with respect to the forming surface of the bump electrodes. Therefore, the elastic deformation of the bump electrodes absorbs the distance fluctuation between the bump electrodes and the terminals. Therefore, a preferable bonding strength is obtained between the bump electrodes and the terminals, even though the substrate and the electronic component include the terminals and the bump electrodes with an uneven height (level). Consequently, this mounting structure improves the reliability of the conductive connection status at each coupling section, as well as the mounting strength of the electronic component with respect to the substrate.

It is preferable that, in the mounting structure of an electronic component, the conductive film directly make conductive contact with an entire top surface of the terminal.

Since the conductive film of the bump electrode is in direct conductive contact with the entire top surface of the terminal, the conductive film obtains a direct conductive contact with at least part of the surface along the thickness direction of the terminal, as well as the entire top surface of the terminal. Consequently, a large contact area is ensured between the conductive film of the bump electrode and the terminal, and the preferable conductive connection status is provided. At the same time, the bonding strength between the bump electrode and the terminal increases, thereby improving the reliability of the conductive connection status.

It is preferable that, in the mounting structure of an electronic component, the surface along the thickness direction include two surfaces and the conductive film directly make conductive contact with an entire surface of one of the two surfaces.

Since the conductive film of the bump electrode is in direct conductive contact with one entire surface along the thickness direction of the terminal, the conductive film obtains a direct conductive contact with one entire surface along the thickness direction of the terminal, as well as at least part of the top surface of the terminal. Consequently, a large contact area is ensured between the conductive film of the bump electrode and the terminal, and the preferable conductive connection status is provided. At the same time, the bonding strength between the bump electrode and the terminal increases, thereby improving the reliability of the conductive connection status.

It is preferable that, in the mounting structure of an electronic component, the surface along the thickness direction include two surfaces and the conductive film directly make conductive contact with at least part of each of the two surfaces.

Further, it is preferable that, in the mounting structure of an electronic component, the surface along the thickness direction include two surfaces and the conductive film directly make conductive contact with at least part of each of the two surfaces.

Since the conductive film of the bump electrode is in direct conductive contact with all the surfaces along the thickness direction of the terminal, the conductive film obtains a direct conductive contact with all the surfaces along the thickness direction of the terminal, as well as at least part of the top surface of the terminal. Consequently, a large contact area is ensured between the conductive film of the bump electrode and the terminal, and the preferable conductive connection status is provided. At the same time, the bonding strength between the bump electrode and the terminal increases, thereby improving the reliability of the conductive connection status.

It is preferable that, in the mounting structure of an electronic component, at least part of one of the internal resin and the conductive film abut a surface in a vicinity of the terminal with which the conductive film makes direct contact of the substrate.

Even if there is a fluctuation in the height of the bump electrodes as well as of the terminals, and even if the fluctuation in the distance is therefore present between the terminals and the bump electrodes prior to the bonding thereof, after the bonding, the bump electrodes abut the surface of the substrate in the vicinities of the terminals. Consequently, spots with different compression (elastic deformation) rates are consecutively present inside the internal resin of the bump electrodes. Therefore, the bump electrodes include therein the spots with an optimal coupling force (compression rate) with respect to the terminals, thereby improving the reliability of the bonding (adhesive) property between the bump electrodes and terminals.

Moreover, if the internal resin, in particular, abuts the substrate surface, the internal resin suppresses a current leak (migration) between the adjacent terminals with the internal resin that abuts the substrate surface being interposed therebetween.

Further, it is preferable that, in the mounting structure of an electronic component, at least part of one of the internal resin and the conductive film press and concave a surface in a vicinity of the terminal with which the conductive film makes direct contact of the substrate so as to abut the surface.

Since the bump electrode abuts the substrate surface while concaving the substrate surface in the vicinity of the terminal, the anchor effect improves the bonding (adhesive) strength between the bump electrode and the terminal. Consequently, even if a delaminating force occurs between the bump electrode and the terminal, a preferable conductive connection state is ensured against the delaminating force originating from, for instance, a heat cycle test.

Moreover, as described, there is an improvement in the reliability of the bonding (adhesive) property between the bump electrodes and the terminals, and a current leak (migration) is suppressed between the adjacent terminals.

In this case, the internal resin may be formed approximately like a barrel vault with a transverse sectional surface of one of approximately a half circle, approximately a half oval, and approximately a trapezoid. The conductive film may be provided in a belt-like shape on a top surface of the internal resin along a direction of the transverse sectional surface.

This makes the manufacturing easier, since the plurality of bump electrodes is formed by providing, with intervals, the plurality of conductive films on the top surface of the internal resin.

In this case, the internal resin may be formed either in approximately a hemispheroid or approximately a circular truncated cone, and the conductive film may be provided covering the top surface of the internal resin.

Here, since the bump electrode is curved in all directions from the center thereof, in any direction the misalignment may occur relative to the terminals, the bump electrode follows the corner shape of the terminal in approximately the same state with respect to the terminal. Consequently, it is possible to ensure a stable conductive connection with the terminals.

BRIEF DESCRIPTION OF THE DRAWINGS

The invention will be described with reference to the accompanying drawings, wherein like numbers reference like elements.

DESCRIPTION OF EXEMPLARY EMBODIMENTS

An embodiment of a mounting structure according to an aspect of the present invention will now be described in detail.

Figure 1:
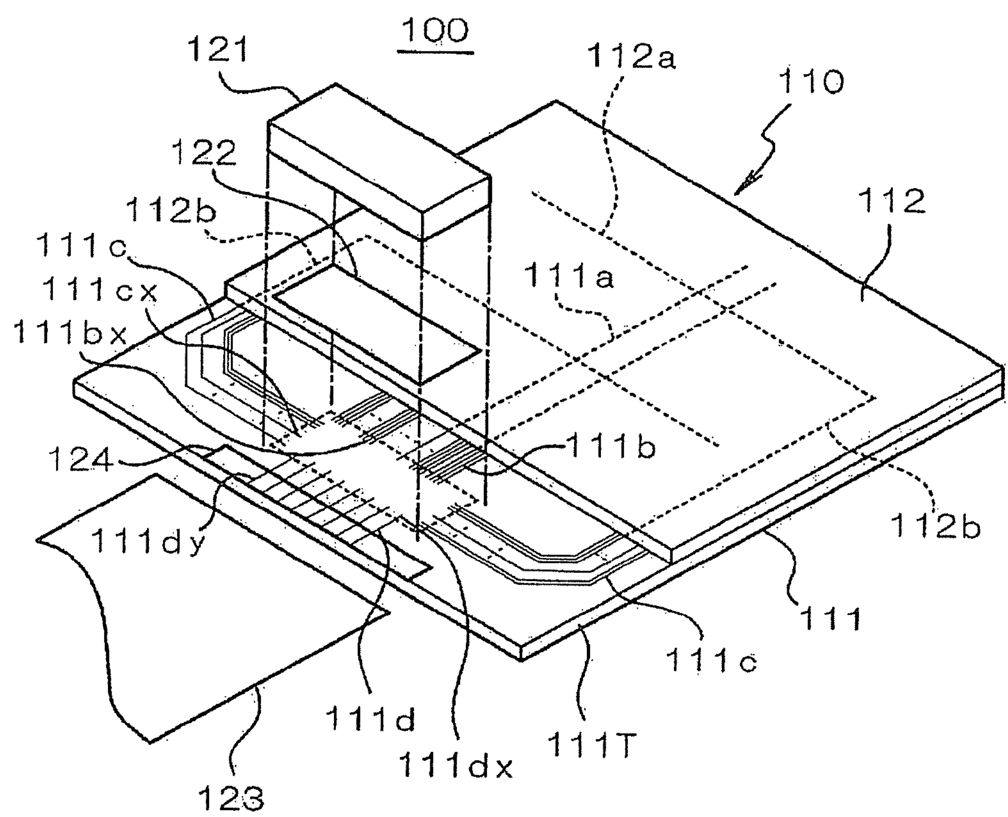
FIG. 1 is a schematic perspective view illustrating a structure of a liquid crystal device in which an aspect of the invention is applied.

FIG. 1 is a schematic drawing illustrating a liquid crystal device in which the mounting structure of an electronic component according to the aspect of the invention is applied. One example application of the mounting structure of an electronic component according to the aspect of the invention will be described.

A numeral 100 in FIG. 1 indicates a liquid crystal device, and the liquid crystal device 100 is formed including a liquid crystal panel 110 and an electronic component (IC chip for liquid crystal drive) 121. Un-illustrated supplementary members such as a polarizing plate, a refection sheet, and backlight are optionally provided to the liquid crystal device 100 as needed.

The liquid crystal panel 110 is formed including substrates 111 and 112 made of glass or synthesized resin. The substrate 111 and the substrate 112 are arranged to face each other, and are adhered together by a material such as an un-illustrated sealer. Un-illustrated liquid crystal, which is the electro-optical material, is sealed between the substrate 111 and the substrate 112. An electrode 111_a_ made from a transparent conductive material such as indium tin oxide (ITO) is formed on an inner surface of the substrate 111, and an electrode 112_a_ is formed on an inner surface of the substrate 112, arranged to face the electrode 111_a_.

The electrode 111_a_ is coupled with a wiring 111_b_ formed with the same material as an integral unit, and is pulled out onto an inner surface of a substrate protrusion 111T provided to the substrate 111. The substrate protrusion 111T is a part that extends outward from an outline of the substrate 112 at the edge of the substrate 111. One end of the wiring 111_b_ becomes a terminal 111_bx_. The electrode 112_a_ is coupled with a wiring 112_b_ formed as an integral unit with the same material as that of the electrode 112_a_, and has a conductive connection with a wiring 111_c_ of the substrate 111 through a top-down electrical continuity unit. This wiring 111_c_ is also formed with ITO. The wiring 111_c_ is pulled out onto the substrate protrusion 111T, and one end of the wiring 111_c_ becomes a terminal 111_cx_. An input wiring 111_d_ is formed in the vicinity of an end edge of the substrate protrusion 111T, and one end of the input wiring 111_d_ becomes a terminal 111_dx_. The terminal 111_dx_ is arranged to face the terminal 111_bx_ and the terminal 111_cx_. Moreover, the other end of the input wiring 111_d_ becomes input terminals 111_dy_.

The electronic component 121 according to the aspect of the invention is mounted over the substrate protrusion 111T with a sealing resin 122 interposed therebetween. The electronic component 121 is, for instance, an IC chip for liquid crystal drive that drives the liquid crystal panel 110. Un-illustrated multiple bump electrodes according to the aspect of the invention are formed on a lower surface of the electronic component 121, and these bump electrodes respectively have a conductive connection with the terminals 111*bx*, 111*cx*, and 111*dx* on the substrate protrusion 111T. This constitutes the mounting structure according to the aspect of the invention, the mounting structure including the electronic component 121 mounted on the substrate 111.

A flexible wiring substrate 123 is mounted in an array area of the input terminals 111*dy* on the substrate protrusion 111T with an anisotropic conductive film 124 imposed between the array area and the flexible wiring substrate 123. The input terminals 111*dy* respectively have a conductive connection with un-illustrated corresponding wirings that are provided to the flexible wiring substrate 123. The input terminals 111*dy* are supplied with control signals, imaging signals, and power potentials from an external source through this flexible wiring substrate 123. The control signals, imaging signals, and power potentials supplied to the input terminals 111*dy* are input into the electronic component 121 in which the drive signals for driving liquid crystal are generated so as to be supplied to the liquid crystal panel 110. It is common and preferable that the flexible substrate be a flexible organic substrate formed with materials such as polyimide and liquid crystal polymer, and that circuit patterns and terminals be formed on that substrate with copper and aluminum. However, the configuration of the flexible substrate is not limited thereto. It is more preferable that the terminals be gold plated, so as to stabilize the connection resistance.

The liquid crystal device 100 with the above structure allows modification of light independently for each pixel which is formed in the area in which the electrodes 111*a* and 112*a* are counter arranged, by impressing appropriate voltages between the electrode 111*a* and the electrode 112*a* through the electronic component 121, thereby forming a desired image in a display area of the liquid crystal device 100.

Embodiments of the mounting structure of the electronic component applied to the liquid crystal device 100 according to the aspect of the invention will now be described.

Figure 2A:
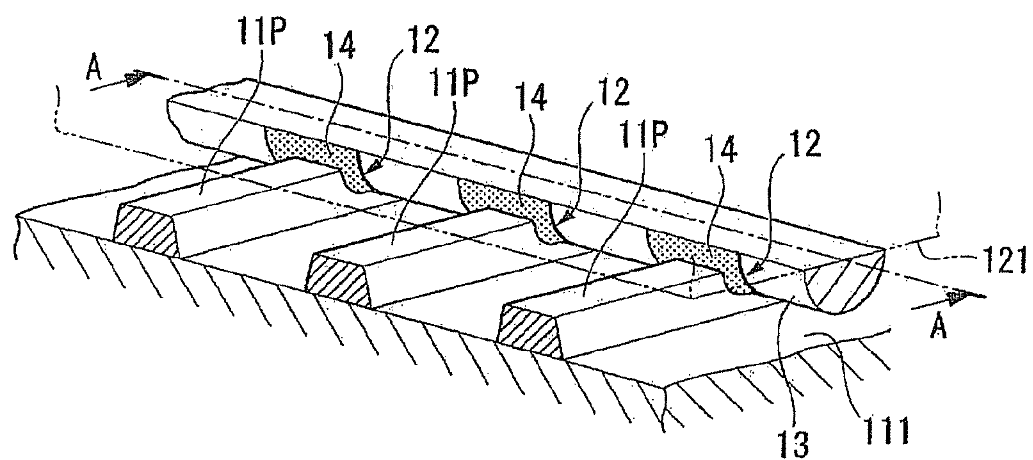
FIGS. 2A and 2B are magnified views of a main part of a mounting structure according to an aspect of the invention.
Figure 2B:
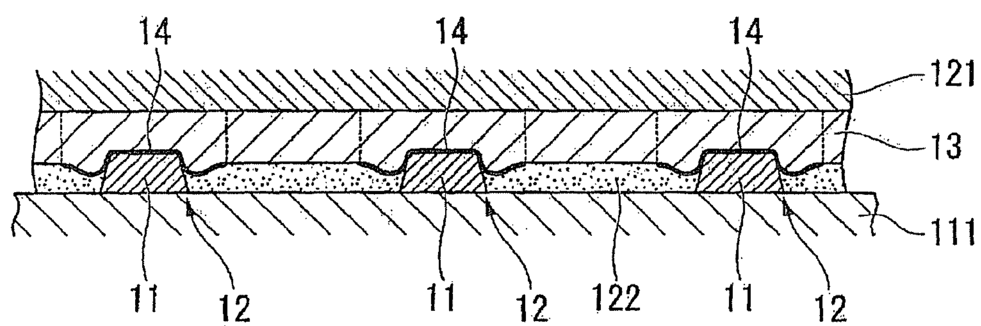

FIG. 2A is a magnified perspective view illustrating a main part of the mounting structure of the electronic component 121 of the liquid crystal device 100. FIG. 2B is a sectional view along A-A line in FIG. 2A. A numeral 11P in FIGS. 2A and 2B indicates a wiring pattern provided on the substrate 111, and a numeral 11 indicates the terminals installed in the wirings, i.e. any of the above-described terminals 111*bx*, 111*cx*, and 111*dx*. In this embodiment, the terminals 11 have a relatively thick film thickness, which therefore means that the height of the terminals 11 is tall, and the cross section thereof is approximately trapezoid. A numeral 12 each indicates a bump electrode provided to the electronic component 121. The sealing resin 122 is, as illustrated in FIG. 2B, while the illustration thereof is omitted in FIG. 2A, disposed to be filled and cured between the substrate 111 and the electronic component 121, the sealing resin 122 covering around at least a conductive contact area of the bump electrodes 12 and of the terminals 11. It is preferable that the sealing resin 122 be resins such as epoxy, acrylic, and phenol, while the type of resin is not limited thereto, as long as the material being used is resin.

Figure 3A:
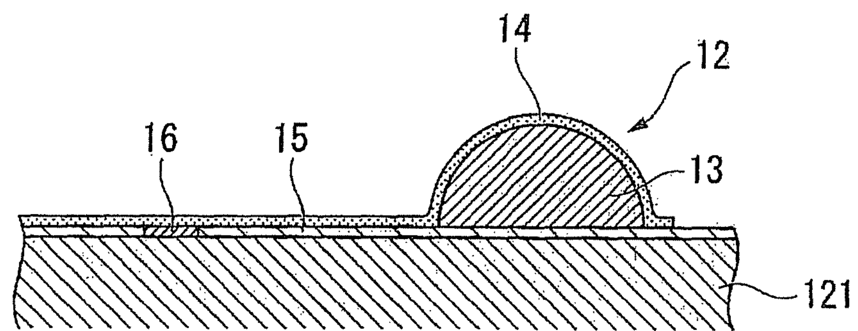
FIGS. 3A and 3B are sectional side views illustrating a schematic structure of a bump electrode.
Figure 3B:
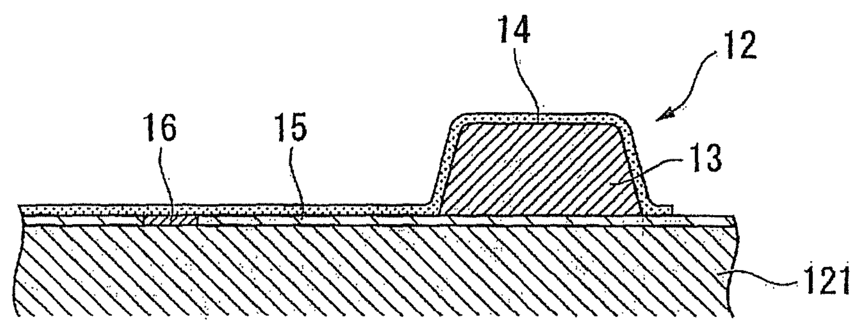

In these embodiments, as illustrated in FIG. 2A, FIGS. 3A and 3B, each of the bump electrodes 12 has, as a core, a structure which includes internal resin 13 shaped approximately like a barrel vault provided on the electronic component 121, with a surface of the internal resin 13 being covered by a conductive film 14. The conductive film 14 is, as shown in FIGS. 3A and 3B, disposed on the surface of the electronic component 121, so as to be coupled and electrically continued to an electrode 16 exposed to an opening in an insulating film 15, and is lead onto the internal resin 13. The conductive film 14 covering the surface of the internal resin 13 in such a structure is electrically continued to the electrode 16, thereby substantially functioning as an electrode of the electronic component 121. In these embodiments, the conductive film 14 is provided in plurality, and conductive films 14 each shaped like a band are provided on the surface of the internal resin 13. Each of these conductive films 14 is independently coupled and electrically continued to the electrode 16 of the electronic component 121. Therefore, these conductive films 14 independently function, together with the internal resin 13 positioned at an inner side of each conductive film 14, as the bump electrodes 12 according to the aspect of the invention.

Here, the aforementioned "approximately a barrel vault shape" means a columnar shape in which the inner (bottom) surface that is in contact with the electronic component 121 is flat, and the outer surface that is not in contact therewith is curved. Specifically, the preferably used bump electrodes 12 have sectional shapes such as approximately half circle as shown in FIG. 3A, approximately half oval (not illustrated), and approximately trapezoid as shown in FIG. 3B. Here, each of the bump electrodes 12 with the approximately trapezoid cross-sectional shape as shown in FIG. 3B has a bent at least at a shoulder between the top and the side in this cross-sectional shape. This makes, as described, the outer surface that is not contact with the electronic component 121*a* curved surface.

The internal resin 13 is formed with photosensitive resin and thermosetting resin, specifically, resins such as polyimide, acrylic, phenol, silicone, silicone-modified polyimide, and epoxy resins. Such internal resin 13 is formed, as described, approximately like a barrel vault by known techniques of lithography and etching. The material of resin (hardness) and its detailed shape of the approximate barrel vault (heights and widths) are optionally selected and designed in accordance with the shape and the size of the terminals 11 as described below.

The conductive films 14 are made of metals and alloys such as Au, TiW, Cu, Cr, Ni, Ti, W, NiV, Al, Pd, and lead-free solder, and may be any one of a single layer and a multilayer of these metals (alloys). Such conductive films 14 may be deposited with a known film deposition method such as sputtering and thereafter be patterned into a band shape, or, may be selectively formed by electroless plating. Alternatively, an underlying film may be formed with methods such as sputtering and electroless plating, and thereafter an upper layer film may be formed thereon with electroplating, so as to form the conductive films 14 with a multilayer film composed with the underlying film and the upper layer film. The type, a layer structure, a film thickness, and width of the metal (alloy) are optionally selected and designed, similar to the case of internal resin 13, in accordance with the shape and the size of the terminals 11. However, it is preferable that gold (Au) that excels, in particular, in flatting property be used for the conductive films 14, since the conductive films 14 elastically deform following corner shapes of the terminals 11 as will be described later. Moreover, in case of forming the conductive films 14 in multilayer, it is preferable that gold be used on the outermost layer. Moreover, it is preferable that the width of the conductive films 14 be sufficiently wider than that of the terminals 11 to be bonded.

Figure 4A:
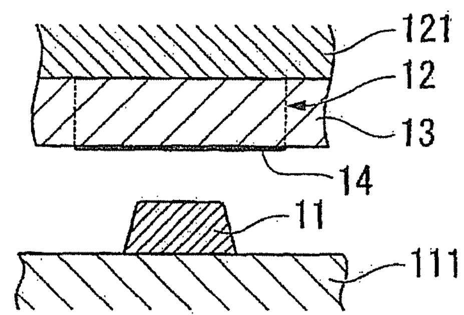
FIGS. 4A through 4D are drawings for describing the mounting structure according to an embodiment.
Figure 4B:
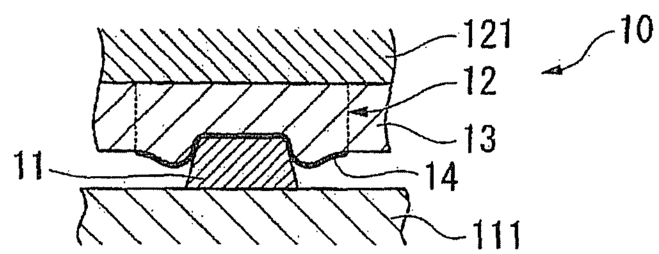
Figure 4C:
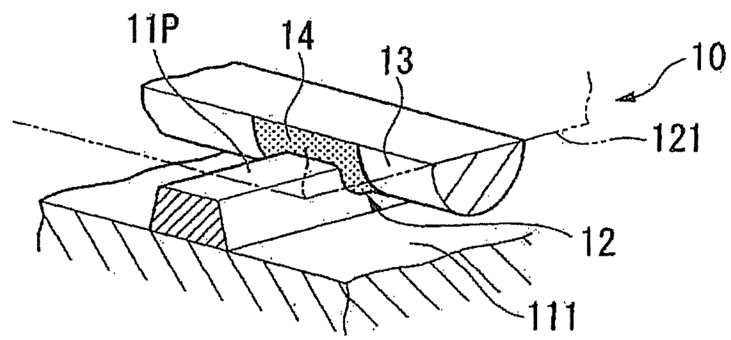

FIG. 4A is a drawing illustrating a status before mounting the electronic component 121 to the substrate 111, and is a magnified sectional view corresponding to the main parts of the FIG. 2B. Hereafter, the terminals 11, the bump electrodes 12, and the conductive films 14 are described in singular. The substrate 111 and the electronic component 121 are positioned so that the terminal 11 and the bump electrode 12 face each other. In this state, a pressure is applied to the direction to bond each other, so that the conductive film 14 of the bump electrode 12 is bonded with the terminal 11 as shown in FIGS. 4B and 4C, thereby having a conductive contact. In the state of the conductive film 14 and the terminal 11 having a conductive contact, in other words, in a state in which a predetermined pressure is applied, the sealing resin 122 (refer to FIG. 2B) as the holding unit according to the aspect of the invention is filled and cured between the substrate 111 and the electronic component 121. Consequently, a mounting structure 10 as a first embodiment of the invention is obtained. At this time, the sealing resin 122 as the holding unit may be provided in advance between the substrate 111 and the electronic component 121 in a non-cured state (or half cured state), so as to be cured after making the a conductive contact between the conductive film 14 and the terminal 11. Moreover, the filling of the sealing resin 122 between the substrate 111 and the electronic component 121 may be carried out after making a conductive contact between the conductive film 14 and the terminal 11, and may be cured thereafter.

In the mounting structure 10 formed as described and is recited as the first embodiment of the invention, the electronic component 121 is pressed relative to the substrate 111, and the bump electrode 12 abuts the terminal 11 and is further pressed in this status, so as to be elastically (compressively) deformed into desired shapes. In other words, the bump electrode 12 that includes internal resin 13 as a core is sufficiently flexible compared to the terminal 11 which is made of metal, and therefore is elastically deformed and compressed by the applied pressure. At this time, since the internal resin 13 and the conductive film 14 thereon are formed to be wider than the terminal 11, they bulge around the terminals 11 (to the side surface thereof), and take shapes that follow all the corner shapes of the terminals 11.

In other words, the bump electrode 12 follows the shapes of all the corners of the terminal 11 by elastic deformation mainly of the internal resin, thereby providing the conductive film 14 with a direct conductive contact with at least part of a top surface of the terminal 11 as well as all the surfaces along a thickness direction of the terminal 11. Here, referring to FIG. 4D which is a magnified view of FIG. 4B, side surfaces 11*b* positioned at both sides of a top surface 11*a* of the terminal 11 indicate the surfaces along the thickness direction, and the corners are indicated by corners 11*c* which are formed by the top surface 11*a* meeting the side surfaces 11*b*. In this embodiment, the cross-sectional shape of the terminal 11 is approximately trapezoid. However, it may also be rectangular. Moreover, the terminal 11 may also be relatively thin (short), and not limited to being thick (tall), in terms of the thickness (height) thereof.

Figure 4D:
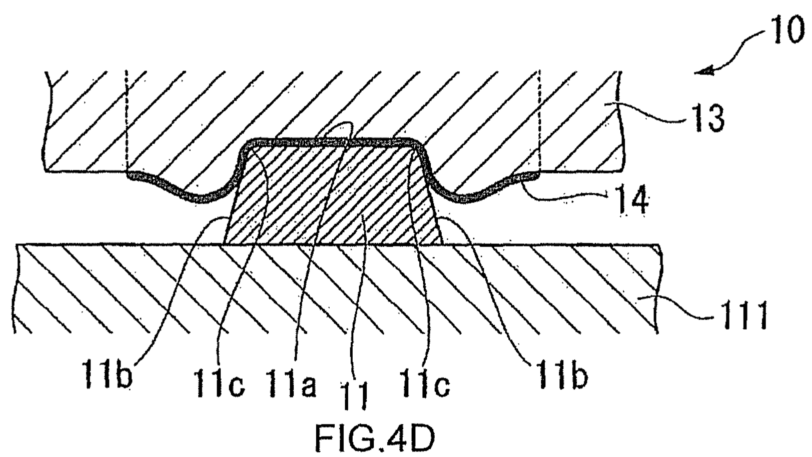
Figure 5A:
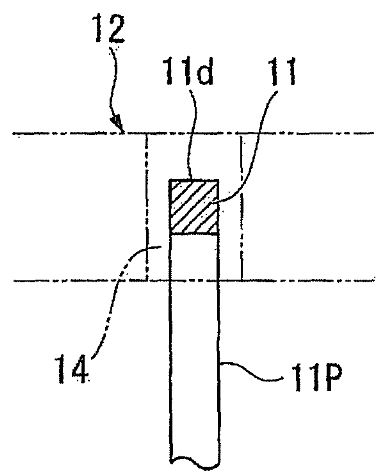
FIGS. 5A and 5B are magnified plan views for describing structures of terminals.

The terminal 11 of the substrate 111 may be, as illustrated in a magnified plan view of FIG. 5A, an end point of a wiring pattern 11P. In this case, as shown in oblique lines in FIG. 5A, a region which has a preset length when measured from the end edge of the wiring pattern 11P becomes the terminal 11 according to the aspect of the invention. The terminal 11 may also be, as illustrated in a magnified plan view of FIG. 5B, a region indicated in oblique lines, i.e. a land formed to be wider than the wiring pattern 11P at its end. In the mounting structure 10 shown in FIG. 4D, the conductive film 14 of the bump electrode 12 is in direct conductive contact with the top surface of the terminal 11, i.e. the entire surface of the region (the whole region) illustrated in FIGS. 5A and 5B.

The bump electrode 12 follows the shapes of all the corners of the terminal 11 by elastic deformation, and therefore the conductive film 14 is, as described, also in a direct conductive contact with a part of the side surfaces 11*b* of the terminal 11. In the case of the terminal 11 having a shape shown in FIG. 5A, the conductive film 14 is also in direct conductive contact with a part of an outer surface 11*d* of the terminal 11, the outer surface 11*d* being an end edge of the wiring pattern 11P. In the case of the terminal 11 having a shape shown in FIG. 5B, in addition to the outer surface 11*d* of the terminal 11, the conductive films 14 are also respectively in direct conductive contact with a part of an inner surface 11*e* at the opposite side of the outer surface 11*d*.

Here, while in FIG. 4D, the conductive film 14 contacts approximately an upper half of the side surfaces 11*b*, it may also contact only the top ends of the side surfaces 11*b*. In addition, the conductive film 14 may contact only the top ends of the outer surface 11*d* and inner surface 11*e*. In other words, in the mounting structure according to the aspect of the invention, the conductive film 14 needs to contact, by following the corner shapes of the terminals 11, only a part of the side surfaces 11*b*, the outer surface 11*d*, and the inner surface 11*e*. That is to say, the bump electrode 12 following the corner shapes of the terminal 11 by elastic deformation allows the conductive film 14 to contact at least a part of the side surfaces 11*b*, the outer surface 11*d*, and the inner surface 11*e* of the terminal 11.

In this mounting structure 10, the bump electrode 12 following the corner shapes of the terminal 11 allows the conductive film 14 to be in direct conductive contact with the entire top surface 11*a*, as well as a part of the side surfaces 11*b*, the outer surface 11*d*, and the inner surface 11*e* of the terminal 11. Moreover, this state of conductive contact is held by the sealing resin 122. Therefore, sufficient amount of contact areas are ensured between the conductive film 14 and the terminal 11, providing a favorable conductive connection therebetween. Elastic restoring force (repelling force) generated against the terminal 11 due to the elastic deformation of the internal resin 13 of the bump electrode 12 increases the bonding strength between the bump electrode 12 and the terminal 11, thereby improving the reliability of the conductive connection status. Specifically, the bump electrode 12 follows the shapes of the corners 11*c* of the terminal 11 with the elastic deformation, so that the restoring force of the internal resin 13 works in a away that the corners 11*c* are wrapped. Therefore, the bonding strength between the bump electrode 12 and the terminal 11 is increased as described. Consequently, the mounting structure 10 according to the first embodiment has an excellent property of improved reliability in the conductive connection status with sufficiently improved bonding strength between the bump electrode 12 and the terminal 11.

Figure 6:
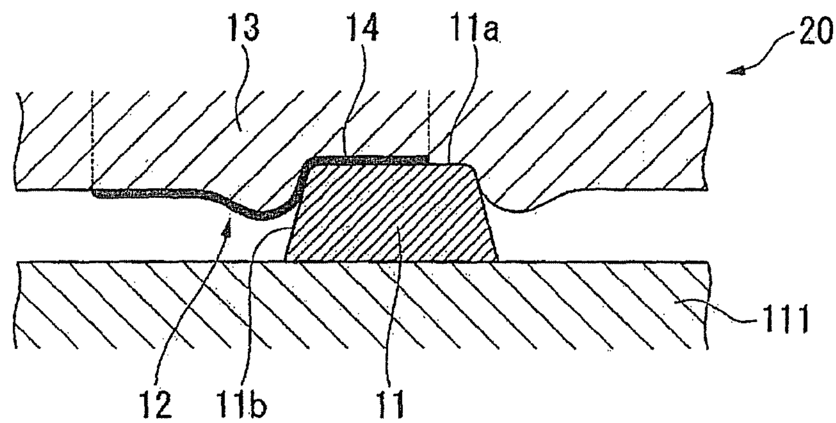
FIG. 6 is a drawing for describing the mounting structure according to another embodiment.

FIG. 6 is a drawing illustrating a second embodiment of the mounting structure of the electronic component according to the aspect of the invention. The second embodiment is different from the first embodiment shown in FIG. 4D in that the conductive film 14 in the bump electrode 12 follows only the corners 11*c* of one side, and not the corners 11*c* of both sides.

In recent years, size reduction, as well as an increase in the degree of high-integration of mounting structures of electronic components are accelerating, and so as the narrowing of wiring pitch and a wiring width. Therefore, due to the misalignment of bump electrodes and terminals and the mispositioning of substrates and electronic components during the manufacturing, sufficient bonding strength cannot be obtained between these bump electrodes and the terminals, and this may cause a contact defect (conductive defect).

For this reason, the mounting structure in the second embodiment has a structure that prevents the contact defect even there is a misalignment or a misposition.

Figure 5B:
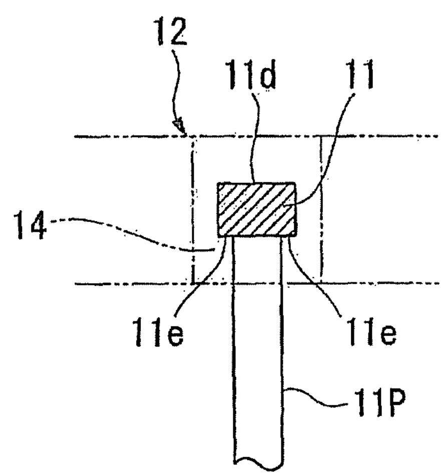

Specifically, in a mounting structure 20 shown in FIG. 6, the misalignment and the misposition cause the bump electrode 12 to jolt out of alignment in the width direction of the terminal 11, i.e. the wiring pattern 11P referred in FIGS. 5A and 5B. Therefore, the conductive film 14 is not in direct contact with an entire surface of the top surface 11*a* of the terminal 11, and is in direct contact with only one of the side surfaces 11*b*. Even with the misalignment in the mounting structure 20 in this embodiment however, the shape of the corners 11*c* at one side of the terminal 11 is followed, as described. Therefore the conductive film 14 is in direct conductive contact with a part of the top surface 11*a* as well as a part of at least one of the side surfaces 11*b* of the terminal 11. Moreover, this state of conductive contact is held by the un-illustrated sealing resin 122.

Therefore, sufficient amount of contact areas are ensured between the conductive film 14 and the terminal 11, providing a favorable conductive connection therebetween. Elastic restoring force (repelling force) generated against the terminal 11 due to the elastic deformation of the internal resin 13 of the bump electrode 12 increases the bonding strength between the bump electrode 12 and the terminal 11, thereby improving the reliability of the conductive connection status. Since the restoring force of the internal resin 13 works so as to wrap one of the corners 11*c*, the bonding strength between the bump electrode 12 and the terminal 11 increases as described above.

Consequently, the mounting structure 20 formed including the misalignment and the misposition inherent therein also prevents contact defects and has an excellent property of improved reliability in the conductive connection status, with sufficiently improved bonding strength between the bump electrodes 12 and the terminals 11.

Figure 7:
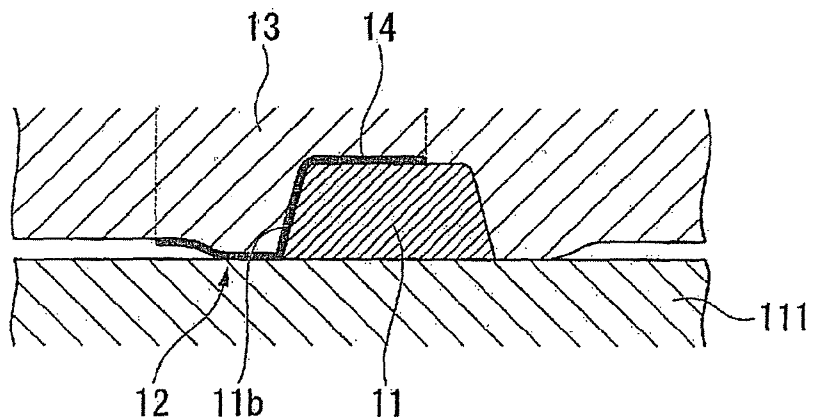
FIG. 7 is a drawing for describing a modification of the mounting structure according to this embodiment.

The characteristics of the internal resin 13, particularly the hardness and the elastic deformability (compressive property), may be optionally modified in accordance with attributes such as the type and composition of the resin as well as a processing condition. The degree of elastic deformation of the bump electrode 12 during the mounting may also be modified in accordance with attributes such as a pressure condition between the substrate 111 and the electronic component 121. Based on the above, as a modification of the second embodiment, it may be that the degree of the elastic deformation (compression) of, in particular, the bump electrode 12 is increased, so that the conductive film 14 abut the entire surface of one of the side surfaces 11*b* as shown in FIG. 7.

This ensures a large contact area between the conductive film 14 and the bump electrode 12 of the terminal 11, thereby providing a preferable state of conductive connection. Moreover, the bonding strength between the bump electrode 12 and the terminal 11 is increased and the reliability in the state of conductive connection is improved.

Figure 8:
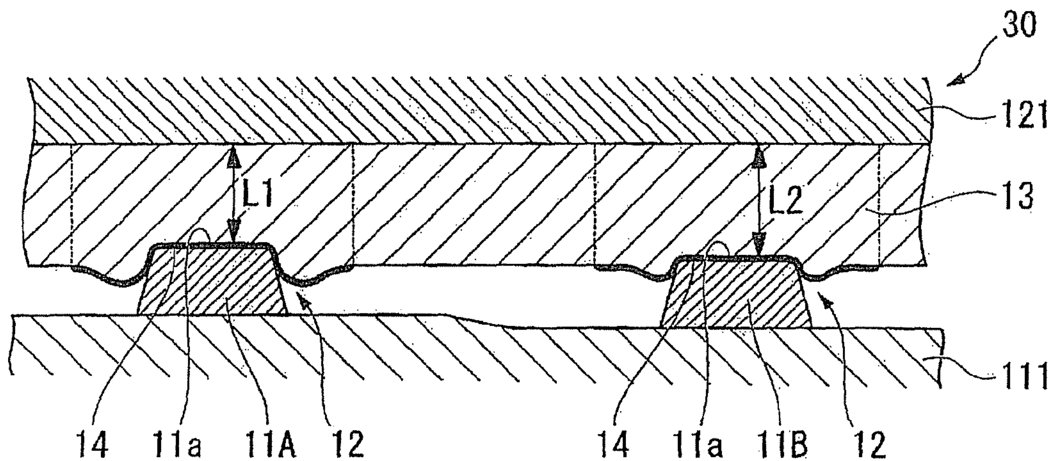
FIG. 8 is a drawing for describing the mounting structure according to still another embodiment.

FIG. 8 is a drawing illustrating a third embodiment of the mounting structure of the electronic component according to the aspect of the invention. The third embodiment is different from the first embodiment shown in FIG. 4D in that there are the pluralities of bump electrodes 12 and terminals 11 respectively provided on the electronic component 121 as well as on the substrate 111, so that the bonding (coupling) is conducted between the pluralities of bump electrodes 12 and terminals 11, and that, in particular, the height levels of the terminals 11 are uneven.

In the case where the plurality of the terminals 11 is formed on the substrate 111, a distortion of the substrate 111 and the like may cause a fluctuation in the height (level) of the bonding surface (top surface) of each of the terminals 11 relative to the bump electrodes 12. This means that the top surfaces (bonding surfaces) of these terminals 11 have different distances relative to the forming surface of the bump electrodes 12 of the electronic component 121. Similarly, the electronic component 121 may have an uneven height at the bonding surface of the bump electrodes 12.

As described, when coupling the substrate 111 to the electronic component 121 at the pluralities of bump electrodes 12 and the terminals 11, while there is a fluctuation in the distance between these bump electrodes 12 and the terminals 11 prior to their bonding, this fluctuation makes it difficult to couple all the bump electrodes 12 with all the terminals 11 in a preferable strength. Here, the substrate 111 includes the terminals 11 with uneven height, and the electronic component 121 includes the bump electrodes 12 with uneven height.

However, a mounting structure 30 according to the third embodiment shown in FIG. 8 has a preferable bonding (coupling) state between a terminal 11A and one of the bump electrodes 12 as well as between a terminal 11B and another one of bump electrodes 12, even when the substrate 111 distortion causes the height of the terminal 11A to be different from that of the terminal 11B. In other words, even when a distance L1 is different from a distance L2, the distance L1 being a distance between the top surface 11*a* of the terminal 11A and the forming surface of the bump electrodes 12 of the electronic component 121, and the distance L2 being the distance between the top surface 11*a* of the terminal 11B and the forming surface of another one of the bump electrodes 12.

That is to say, in this mounting structure 30, the elastic deformation of the bump electrodes 12 absorbs a difference between the distance L1 and the distance L2, i.e. the fluctuation in the distance between the bump electrodes 12 and the terminals 11. Here, the degree of elastic deformation changes inside the bump electrodes 12, each of which containing the internal resin 13, in proportion with the distance L1 and the distance L2 relative to the terminals 11 to be bonded. Consequently, the substrate 111 and the electronic component 121 obtain a preferable bonding strength between the bump electrodes 12 and the terminals 11, since the elastic deformation of the bump electrodes 12 absorbs the fluctuations in the height (level) of the terminals 11 as well as of the bump electrodes 12.

Figure 9:
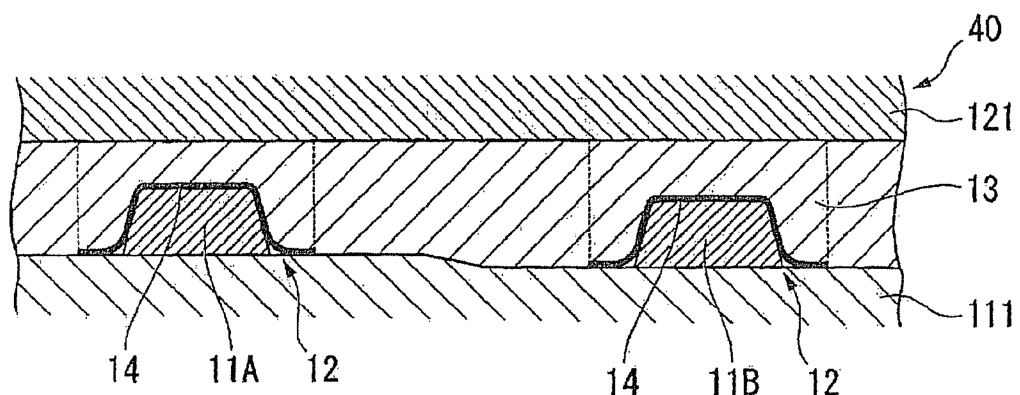
FIG. 9 is a drawing for describing a modification of the mounting structure according to this embodiment.

It is preferable that the degree of elastic deformation (compression) of the bump electrodes 12 be increased, if the pluralities of terminals 11 and the bump electrodes 12 are bonded (coupled). In other words, it is preferable that each of the bump electrodes 12 partly abuts the surface of the substrate 111 in a vicinity of each of the terminals 11 so as to have a conductive contact with the terminals 11, as illustrated as a mounting structure 40 shown in FIG. 9. Here, the degree of elastic deformation may be increased by increasing deformability (compressive property) of the internal resin 13, and/or by increasing the pressure force between the substrate 111 and the electronic component 121 during the mounting. The bump electrodes 12 referred to above include not only the conductive films 14 and the internal resin 13 covered by the conductive films 14, but also the internal resin 13 present in the vicinities of the conductive films 14, i.e. the internal resin 13 being exposed and not covered by the conductive films 14.

Even if the fluctuation in the distance between the terminals 11 and the bump electrodes 12 is present prior to the bonding thereof, after the bonding, the bump electrodes 12 abut the surface of the substrate 111 in the vicinities of the terminals 11. Consequently, the elastic deformation of the bump electrodes 12 ensures the absorption of the aforementioned fluctuation in the height of the terminals 11 and of the bump electrodes 12. Therefore, in this mounting structure 40, a preferable bonding strength is obtained between the bump electrodes 12 and the terminals 11. Moreover, spots with different compression rate (elastic deformation rate) are consecutively present inside the internal resin 13 of the bump electrodes 12. Therefore, the bump electrodes 12 include therein the spots with an optimal coupling force (compression rate) relative to the terminals 11. This improves the reliability of the bonding (adhesively) between the bump electrodes 12 and the terminals 11.

Moreover, since the internal resin 13 positioned in the vicinities of the conductive films 14 abut the surface of the substrate 111, the insulating internal resin 13 prevents a current leak (migration) between the adjacent terminals 11A and 11B with the internal resin 13 abutting the surface of the substrate 111 interposed therebetween.

Figure 10:
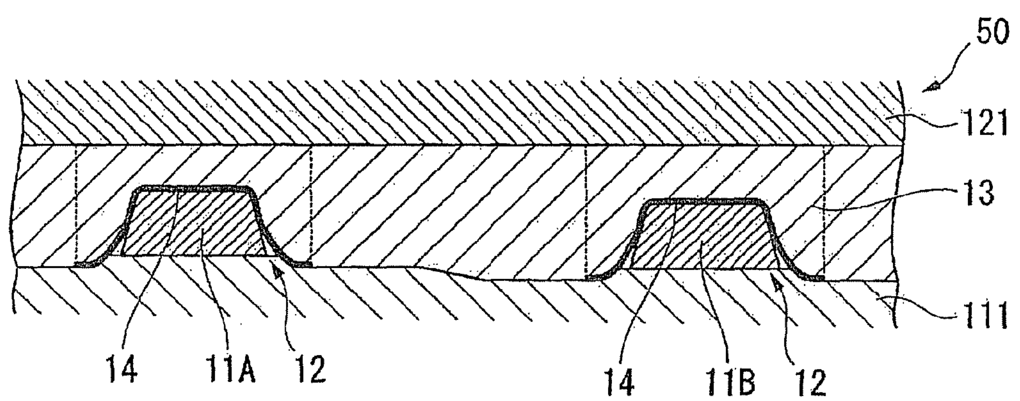
FIG. 10 is a drawing for describing another modification of the mounting structure according to this embodiment.

In the case of bonding (coupling) the pluralities of terminals 11 and bump electrodes 12, it is preferable that a part of the respective bump electrodes 12 abut the surface of the substrate 111 in a state in which the bump electrodes 12 press the surface of the substrate 111 in the vicinities of the terminals 11, concaving the surface of the substrate 111, so that the bump electrodes 12 conductively contact the terminals 11, as in a mounting structure 50 shown in FIG. 10. This is achieved by adjusting the deformability (compressive property) of the internal resin 13 as well as the pressure force between the substrate 111 and the electronic component 121 during the mounting.

Even if the fluctuation in the height of the terminals 11 and of the bump electrodes 12 is present, the bump electrodes 12 abut and press the surface of the substrate 111 in the vicinities of the terminals 11. Consequently, the elastic deformation of the bump electrodes 12 ensures the absorption of the aforementioned fluctuation. Therefore, in this mounting structure 50, a preferable bonding strength is obtained between the bump electrodes 12 and the terminals 11.

Moreover, the bump electrodes 12 abut the surface of the substrate 111 in the vicinities of the terminals 11 while concaving the substrate 111. This further increases the bonding (adhesive) strength of the bump electrodes 12 relative to the terminals 11 by the anchoring effect. Consequently, even if a delaminating force occurs between the bump electrodes 12 and the terminals 11, a preferable conductive connection state is ensured against this force. Here, the delaminating force originates from, for instance, a heat cycle test.

Moreover, since the internal resin 13 positioned in the vicinities of the conductive films 14 abuts the surface of the substrate 111, the insulating internal resin 13 prevents a current leak (migration) between the adjacent terminals 11A and 11B with the internal resin 13 abutting the surface of the substrate 111 interposed therebetween.

Figure 11:
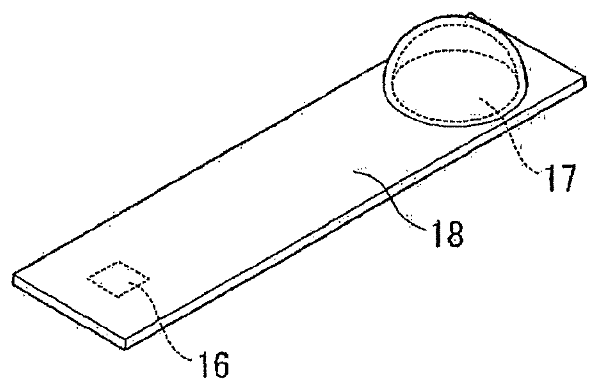
FIG. 11 is a perspective view illustrating a schematic structure of the bump electrode.

The present invention shall not be limited to the above-mentioned embodiments, and may allow various modifications without departing from the main scope of the present invention. For example, as for the structure of the bump electrode, the internal resin is not limited to be shaped approximately like a barrel vault as shown in FIG. 2A as well as in FIGS. 3A and 3B. As shown in FIG. 11, an internal resin 17 may be formed approximately in hemispheroid, and a conductive film 18 may cover an entire top surface of the internal resin 17, the conductive film 18 being provided in a state electrically continuing to the electrode 16 of the electronic component.

Employing such a structure allows this bump electrode to follow the corner shapes of each of the terminals 11 in approximately the same state with respect to the terminals 11, even if the misalignment occurs in any direction relative to each of the terminals 11, since this bump electrode is curved in every direction with approximately the same curvature from the center of the internal resin 17. Consequently, it is possible to ensure a stable conductive connection with each of the terminals 11. The shape of the internal resin 17 may also be a circular truncated cone, in addition to an approximate hemispheroid. Moreover, the conductive film 18 may be provided to cover only a part of the top surface of the internal resin 17 shaped approximately in a hemispheroid or in a circular truncated cone, without covering its entire top surface.

Moreover, in the embodiments described above, the sealing resin 122 is used as the holding unit according to the aspect of the invention, while various mechanical compressing means such as binding by screwing, clipping, and fitting may also be employed. In case of using adhesives (resin), the adhesive may also be selectively disposed, for instance, only between the periphery of the electronic component and the substrate, without being filled around the conductive contact area of the bump electrodes 12 as well as of the terminals 11.

Moreover, instead of the substrate made of glass and synthesized resin, various kinds of substrates may be used for the substrate 111 such as rigid substrate, silicon substrate, and thin ceramics substrate. Examples of electronic component includes, in addition to an IC chip for liquid crystal drive, any electronic component that has a connecting electrode (bump electrode) described above, including various integrated circuits and passive components such as diodes, transistors, light-emitting diode, laser diode, oscillator, and capacitors.

Examples of devices in which the mounting structure of the electronic component according to the aspect of the invention is applied include, in addition to the liquid crystal display device described above, an organic electroluminescence device (organic EL device), a plasma display device, an electrophoretic display device, and devices utilizing electroemissive elements (such as field emission display and surface-conduction electron-emitter display). These devices may be applied to various electro-optical devices and electronic modules.

What is claimed is:

1. An electronic device comprising:

a substrate having a terminal;

an electronic component including a bump electrode, the bump electrode comprising:

a conductive film having contact with the terminal; and a resin covered by the conductive film; and an adhesive having contact with the substrate and the electronic component, wherein the conductive film contacts with at least part of a top surface of the terminal and at least part of a lateral surface of the terminal.

2. The electronic device according to claim 1, wherein the adhesive is composed of a sealing resin filled and cured around a conductive contact area of the bump electrode and the terminal.

3. The electronic device according to claim 1, wherein: the bump electrode is provided to the electronic component in plurality and the terminal is provided to the substrate in plurality; the plurality of terminals includes at least two terminals each having a different distance from the top surface thereof to a surface of the electronic component for forming the bump electrodes; and the bump electrodes include at least two bump electrodes corresponding to the at least two terminals, the at least two bump electrodes elastically deforming to a different degree according to the distance from each top surface of the at least two terminals to the surface of the electronic component for forming the bump electrodes.

4. The electronic device according to claim 1, wherein the conductive film directly makes conductive contact with an entire top surface of the terminal.

5. The electronic device according to claim 1, wherein the lateral surface includes two surfaces and the conductive film directly makes conductive contact with an entire surface of one of the two surfaces.

6. The electronic device according to claim 1, wherein the lateral surface includes two surfaces and the conductive film directly makes conductive contact with at least part of each of the two surfaces.

7. The electronic device according to claim 1, wherein at least part of one of the resin and the conductive film abuts a surface of the substrate in a vicinity of the terminal with which the conductive film makes direct contact.

8. The electronic device according to claim 7, wherein at least part of one of the resin and the conductive film concavely depresses a surface of the substrate in a vicinity of the terminal with which the conductive film makes direct contact so as to abut the surface of the substrate.

9. The electronic device according to claim 1, wherein: the resin is formed approximately like a barrel vault with a transverse sectional surface of one of approximately a half circle, approximately a half oval, and approximately a trapezoid;

and the conductive film is provided in a belt-like shape on the surface of the resin along a direction of the transverse sectional surface.

10. The electronic device according to claim 1, wherein: the resin is formed in one of approximately a hemispheroid and approximately a circular truncated cone; and the conductive film is provided covering the surface of the resin.

* * * * *